United States Patent
Cheng

(10) Patent No.: US 9,529,239 B2
(45) Date of Patent: Dec. 27, 2016

(54) MANUFACTURING METHOD AND REPAIRING METHOD FOR DISPLAY DEVICE AS WELL AS LIQUID CRYSTAL DISPLAY PANEL

(71) Applicant: SHENZHEN CHINA STAR OPTOELECTRONICS TECHNOLOGY CO., LTD., Shenzhen, Guangdong (CN)

(72) Inventor: Yang Ling Cheng, Shenzhen (CN)

(73) Assignee: SHENZHEN CHINA STAR OPTOELECTRONICS TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/241,830

(22) PCT Filed: Jan. 24, 2014

(86) PCT No.: PCT/CN2014/071421
§ 371 (c)(1),
(2) Date: Feb. 27, 2014

(87) PCT Pub. No.: WO2015/100829
PCT Pub. Date: Jul. 9, 2015

(65) Prior Publication Data
US 2015/0185571 A1   Jul. 2, 2015

(30) Foreign Application Priority Data

Dec. 31, 2013  (CN) .......................... 2013 1 0751076

(51) Int. Cl.
*H01L 21/82*   (2006.01)
*G02F 1/1362*  (2006.01)
(Continued)

(52) U.S. Cl.
CPC ....... *G02F 1/136259* (2013.01); *H01L 27/124* (2013.01); *H01L 27/127* (2013.01);
(Continued)

(58) Field of Classification Search
CPC ...................................................... H01L 27/127
(Continued)

(56) References Cited

U.S. PATENT DOCUMENTS

| 6,429,908 B1 | 8/2002 | Lim ............................... 349/54 |
| 2004/0169781 A1 | 9/2004 | Lee et al. ........................ 349/54 |

(Continued)

FOREIGN PATENT DOCUMENTS

| CN | 1610061 A | 4/2005 |
| CN | 201097400 Y | 8/2008 |

(Continued)

OTHER PUBLICATIONS

International Search Report and Written Opinion dated Jan. 24, 2014, issued to PCT/CN2014/071421.
(Continued)

*Primary Examiner* — Hsin-Yi Hsieh
(74) *Attorney, Agent, or Firm* — Stein IP, LLC

(57) ABSTRACT

The present disclosure relates to a method for manufacturing a display device and a method for repairing the display device, and further relates to a liquid crystal display panel including the display device. The method for manufacturing a display device comprises the following steps: (a) forming a gate, a scanning line, a first insulation layer, and a semiconductor layer on a substrate in sequence; (b) determining the position of a data line on the semiconductor layer, and providing an etch stop layer on the semiconductor layer at a place deviating from the data line; (c) modifying the semiconductor layer at the position of the data line into a conductor; and (d) arranging a source, a drain, the data
(Continued)

line, and a second insulation layer on the semiconductor layer. This method can repair the data line by welding the segments of the broken data line onto the conductor layer beneath the data line. The display device manufactured according to the method provided in the present disclosure has the advantages of high quality and easy repairing.

5 Claims, 3 Drawing Sheets

(51) Int. Cl.
  *H01L 27/12*   (2006.01)
  *H01L 29/45*   (2006.01)
  *H01L 29/66*   (2006.01)
  *H01L 29/786*   (2006.01)

(52) U.S. Cl.
  CPC ........ *H01L 29/45* (2013.01); *H01L 29/66969* (2013.01); *H01L 29/7869* (2013.01); *G02F 2001/136268* (2013.01)

(58) Field of Classification Search
  USPC .......................................... 438/130
  See application file for complete search history.

(56) References Cited

U.S. PATENT DOCUMENTS

| | | | |
|---|---|---|---|
| 2006/0050219 A1 | 3/2006 | Lee | 349/141 |
| 2010/0295042 A1* | 11/2010 | Yano | H01L 29/7869 257/43 |
| 2013/0329176 A1* | 12/2013 | Kuniyoshi | G02F 1/1368 349/138 |

FOREIGN PATENT DOCUMENTS

| | | |
|---|---|---|
| CN | 101266373 A | 9/2008 |
| CN | 101833203 A | 9/2010 |
| CN | 102508384 A | 6/2012 |
| CN | 103403849 A | 11/2013 |
| JP | 3640683 B2 | 1/2005 |
| JP | 2010-191107 A | 9/2010 |

OTHER PUBLICATIONS

Chinese Office Action dated Feb. 29, 2016, issued by the Chinese Patent Office in corresponding application 201310751076.3.

* cited by examiner

MANUFACTURING METHOD AND REPAIRING METHOD FOR DISPLAY DEVICE AS WELL AS LIQUID CRYSTAL DISPLAY PANEL

FIELD OF THE INVENTION

The present disclosure relates to a display device, in particular to a display device used for liquid crystal display. The present disclosure further relates to a method for repairing the display device, and a liquid crystal display panel including the display device.

BACKGROUND OF THE INVENTION

Generally, a liquid crystal display panel comprises a display substrate, an opposing substrate facing the display substrate, and a liquid crystal layer between the display substrate and the opposing substrate. The display substrate comprises a switch element and a pixel electrode. Voltage is applied on the liquid crystal layer to control the transmissivity of the light passing through the liquid crystal layer, thereby displaying images.

In the prior art, the switch element is generally a thin film transistor. The source of the thin film transistor is connected with a data line, and the drain thereof is connected with the pixel electrode. The data line is easy to break and difficult to repair, which decreases the qualification ratio of the liquid crystal display panel.

SUMMARY OF THE INVENTION

To solve the above problem, the present disclosure provides a method for manufacturing a display device, according to which a broken data line can be easily repaired, thus increasing the qualification ratio of the display device or liquid crystal display panel. The present disclosure further relates to a method for repairing the display device and a liquid crystal display panel including the display device.

According to a first aspect of the present disclosure, a method for manufacturing a display device is provided, comprising the steps of:

(a) forming a gate, a scanning line, a first insulation layer, and a semiconductor layer on a substrate in sequence;

(b) determining the position of a data line on the semiconductor layer, and providing an etch stop layer on the semiconductor layer at a place deviating from the data line;

(c) modifying the semiconductor layer at the position of the data line into a conductor; and (d) arranging a source, a drain, the data line, and a second insulation layer on the semiconductor layer.

According to the method of the present disclosure, by modifying the semiconductor beneath the data line into a conductor, the resistance-capacitance delay of the thin film transistor can be greatly reduced, thus decreasing line defects caused by the manufacturing procedures.

According to an embodiment, in step (c), the semiconductor layer is modified into a conductor by being exposed to ultraviolet irradiation. For example, the ultraviolet light used can have a wavelength smaller than 400 nm. Under the protection of the etch stop layer, it is convenient to modify the semiconductor into a conductor by being irradiated with such ultraviolet light. In addition, a plurality of components can be treated simultaneously, which greatly increase the processing efficiency.

According to an embodiment, in step (c), the semiconductor layer is modified into a conductor by plasma bombardment. In a preferred embodiment, the plasmas comprise hydrogen ions. Modification of the semiconductor by using plasmas comprising hydrogen ions does not need additional machine platform or manufacturing procedure, which simplifies the operation compared with the modification using the ultraviolet irradiation, thereby facilitates the production.

In an embodiment, the semiconductor layer is made from indium gallium zinc oxide. The carrier mobility of the indium gallium zinc oxide is far higher than that of amorphous silicon. Therefore, by using the indium gallium zinc oxide as the semiconductor layer, the charge/discharge rate of the thin film transistor to the pixel electrode can be greatly increased and the response speed of the pixel electrode can be increased. And a faster response can improve the line scanning rate of pixels, so that an ultrahigh resolution of the display device can be realized, and the display quality can be improved.

In an embodiment, the data line is made from copper or copper alloy. The resistance of copper or copper alloy is very small, which contributes to reducing the resistance-capacitance delay of the thin film transistor.

According to a second aspect of the present disclosure, a method for repairing the above display device is provided. If the data line is broken, it can be repaired by welding the segments of the broken data line onto the conductor layer beneath the data line.

According to the repairing method, because the semiconductor layer beneath the data line has been modified into a conductor layer in advance, the connectivity of the data line can be restored by merely welding the segments of the data line onto the conductor layer, thus completing the repairing. This method greatly reduces the difficulty of the repairing, without bringing any adverse effect on data transmission, thus improving the yield of the display device. In a preferred embodiment, the segments of the data line are welded onto the conductor layer through laser.

According to a third aspect of the present disclosure, a liquid crystal display panel comprising the display device manufactured according to the above method is provided.

All the methods described herein can be executed in any proper order, unless they are indicated otherwise in the text or clearly contradictory with the context. Any and all examples or exemplary expressions (for example, "such as") are used only to better illustrate the embodiments, and should not limit the scope of the present disclosure, unless indicated otherwise. In the present text, none of the expressions in the description should be construed as indication that any component not falling within the scope of the present disclosure is indispensible to implement the invention as described in the text.

Compared with the prior art, the present disclosure has the following advantages. (1) The thin film transistor is configured in a manner that the semiconductor beneath the data line is modified into a conductor, which greatly reduces the resistance-capacitance delay, thus overcoming the defects of signal propagation delay, inter-line interference, and power dissipation caused by the resistance-capacitance delay, and then improving the display quality of the display device. (2) In the thin film transistor, the semiconductor layer is made from indium gallium zinc oxide. The carrier mobility of the indium gallium zinc oxide is far higher than that of amorphous silicon. Therefore, by using the indium gallium zinc oxide as the semiconductor layer, the charge/discharge rate between the thin film transistor and the pixel electrode can be greatly increased and the response speed of the pixel electrode can be increased. A faster response can greatly improve the line scanning rate of pixels, so that an ultrahigh resolution of the display device can be realized and the display quality can be improved. (3) When the display device is being repaired, because the semiconductor layer underneath the data line has been modified into a conductor layer in advance, the connectivity of the data line can be restored by merely welding the segments of the broken data line onto the conductor layer, thus completing the repairing. This method greatly reduces the difficulty of the repairing without bringing any adverse effect on data transmission, thus improving the yield of the display device.

BRIEF DESCRIPTION OF THE DRAWINGS

The present disclosure will be described in more detail below based on the embodiments with reference to the accompanying drawings, in which.

In the accompanying drawings, the same components are indicated by the same reference signs. The accompanying drawings are not drawn to actual scale.

DETAILED DESCRIPTION OF THE EMBODIMENTS

The present disclosure will be further illustrated below in conjunction with the accompanying drawings.

Figure 1:
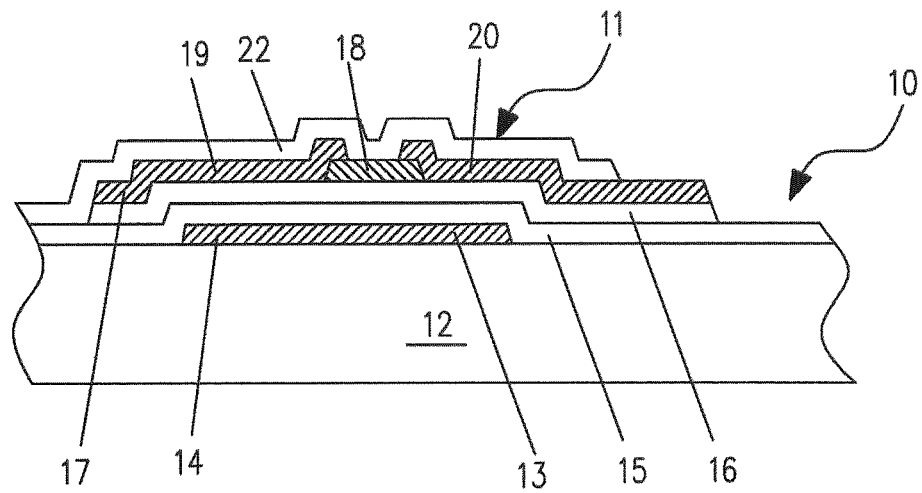
FIG. 1 schematically shows a layer structure of a display device according to the present disclosure.

FIG. 1 schematically shows a layer structure of a display device 10 according to the present disclosure. A thin film transistor 11 is arranged on the display device 10. The thin film transistor 11 is a common switch element in the field of liquid crystal display, the arrangement of which in the display device 10 is well known to those skilled in the art, and thus will not be described in detail here. A method for preparing the thin film transistor 11 will be emphasized herein.

The method for preparing the thin film transistor 11 comprises the following steps.

Firstly, a gate 13 and a scanning line 14 are formed on a substrate 12. Then, a first insulation layer 15 is arranged on the gate 13 and the scanning line 14. Subsequently, a semiconductor layer 16 is formed on the first insulation layer 15, wherein the semiconductor layer 16 is located above the gate 13 and the scanning line 14. Here, the wording "above" means that, a part of the projection of the semiconductor layer 16 over the substrate 12 will fall into the region of the gate 13 and the scanning line 14; however, the semiconductor layer 16 does not directly contact the gate 13 and the scanning line 14, for example, the first insulation layer 15 can be located therebetween. These steps are well known to those skilled in the art, and thus are not described in detail herein.

Figure 2:
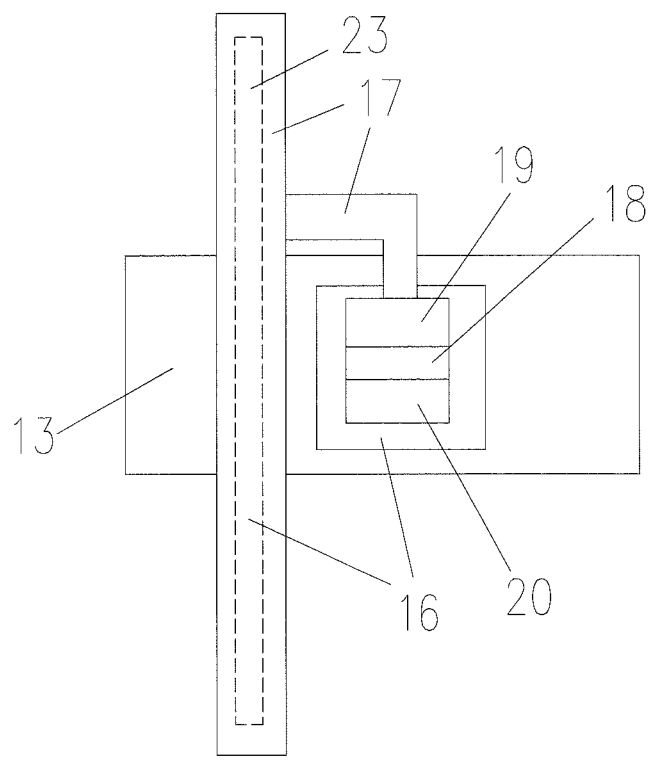
FIG. 2 is a top view of the display device according to the present disclosure.

Next, as shown in FIG. 2, a position 23 of a data line 17 is determined on the semiconductor layer 16. Then, an etch stop layer 18 is arranged on the semiconductor layer 16 at a place deviating from the position 23 of data line 17. And the semiconductor at the position 23 of the data line 17 is modified into a conductor.

Finally, a source 19, a drain 20, the data line 17, and a second insulation layer 22 are arranged on the semiconductor layer 16. In an embodiment, the data line 17 is made from copper or copper alloy. In an example, the copper alloy can be Ti/Cu alloy or Mo/Cu alloy. The data line 17 is further electrically connected with the source 19, and the drain 20 is further electrically connected with the pixel electrode (not shown), in order to form the display device 10. The foregoing is also well known to those skilled in the art, and is not described in detail herein.

By modifying the semiconductor beneath the data line into a conductor, the resistance-capacitance delay (RC delay) of the thin film transistor 11 can be greatly reduced, thus overcoming the defects of signal propagation delay, inter-line interference, and power dissipation caused by the resistance-capacitance delay. Therefore, the display quality of the display device 10 can be improved.

The material of the semiconductor used herein can be indium gallium zinc oxide (i.e., IGZO). The carrier mobility of indium gallium zinc oxide is very high. Therefore, using indium gallium zinc oxide to form the semiconductor layer can greatly increase the charge/discharge rate of the thin film transistor 11 to the pixel electrode, and the response speed of the pixel electrode. Moreover, a faster response can greatly improve the line scanning rate of pixels, so that an ultrahigh resolution of the display device 10 can be achieved, and the display quality can be improved.

Taking indium gallium zinc oxide as an example, in order to modify the semiconductor layer 16 at the position 23 of the data line 17 into a conductor, the etch stop layer 18 should be formed on the semiconductor layer 16 first, and the semiconductor layer 16 at the position 23 of the data line 17 should be exposed. In this case, when being treated, the etch stop layer 18 can protect the semiconductor layer 16 outside the position 23 from being affected, and only the semiconductor layer 16 at the position 23 will be modified into the conductor.

Figure 4:
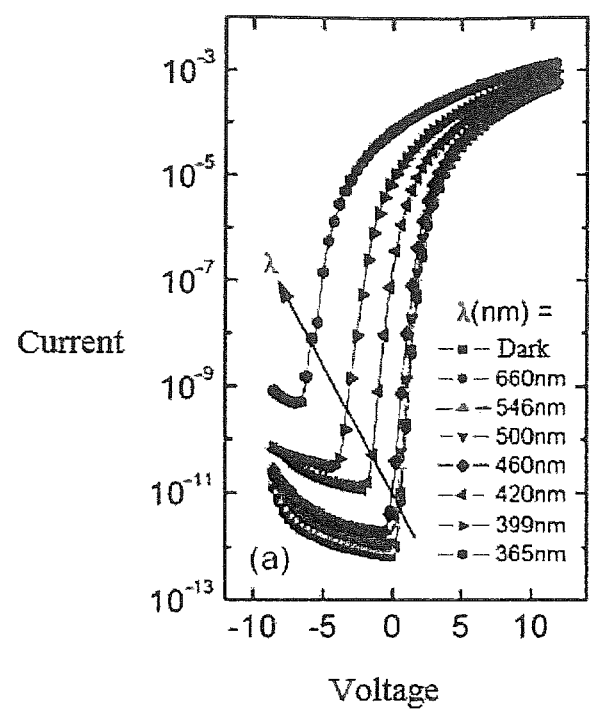
FIG. 4 shows the property change of indium gallium zinc oxide after being irradiated with ultraviolet rays.

Because indium gallium zinc oxide is sensitive to ultraviolet light, it tends to become a conductor under the radiation of the ultraviolet light. Referring to FIG. 4, as the illumination wavelength approaches the ultraviolet zone, the current remarkably increases. Based on the characteristics of the indium gallium zinc oxide, different treatments can be performed thereon respectively before and after the etch stop layer 18 is arranged, so as to modify the semiconductor layer 16 at the position 23 of the data line 17 into a conductor. This can be achieved by irradiating the semiconductor layer 16 at the position 23 with an ultraviolet light having a wavelength smaller than 400 nm, until a desirable conductivity of this position can be obtained. Using ultraviolet ray enables a plurality of components to be treated simultaneously, thus greatly increasing the processing efficiency. In addition, the semiconductor layer at the position 23 can also be modified into a conductor by plasma bombardment. In a preferred embodiment, the plasmas comprise hydrogen ions. Modification of indium gallium zinc oxide using plasmas comprising hydrogen ions does not need an additional machine platform or manufacturing procedure as compared with that using ultraviolet ray, thus simplifies the operation and facilitates the production. Therefore, the modification of indium gallium zinc oxide using plasmas is preferred.

Figure 3:
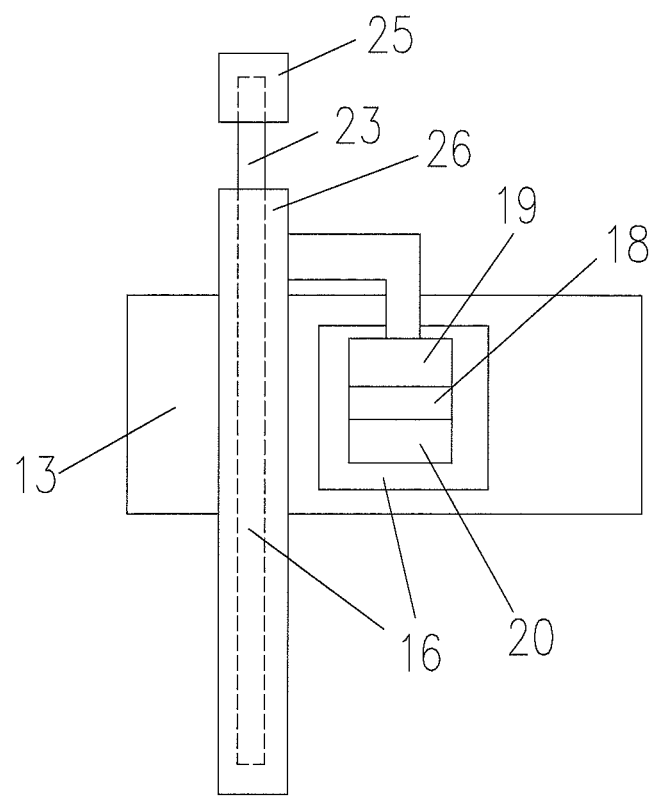
FIG. 3 schematically shows the repairing process of the display device according to the present disclosure.

FIG. 3 schematically shows a method for repairing the display device 10. Because the copper data line 17 is easy to break, and the dimension thereof is very small, for example, 4 to 6 μm in width in general, it is difficult to repair in the subsequent procedures according to the prior art. In the present disclosure, because the semiconductor layer 16 beneath the data line 17 is modified into a conductor in advance, segments 25 and 26 of the broken data line can be welded onto the conductor layer 16 below the data line 17 for repair. In this case, the repairing becomes much easier without bringing any adverse effect on data transmission, thus the yield of the display device 10 can be improved. In a preferred embodiment, the segments 25 and 26 of the data line can be welded onto the conductor layer 16 through laser. A laser is used in the welding because it can focus on a very small spot, but at the same time has very high energy.

The present disclosure further relates to a liquid crystal display panel (not shown) including the display device 10 as mentioned above. Because the major structure of the display device 10 is not changed in the context, those skilled in the art can readily use the display device in the liquid crystal display panel.

Although the present disclosure has been described with reference to the preferred embodiments, various modifications can be made to the present disclosure without departing from the scope of the present disclosure and components in the present disclosure could be substituted by equivalents. Particularly, as long as there is no structural conflict, all the technical features mentioned in all the embodiments may be combined together in any manner. The present disclosure is not limited to the specific embodiments disclosed in the description, but includes all the technical solutions falling into the scope of the claims.

The invention claimed is:

1. A method for repairing a display device comprising steps of:

(a) forming a gate and a scanning line, a first insulation layer, and a semiconductor layer on a substrate in sequence;

(b) predefining a first region of the semiconductor layer associated with a position of a data line, and providing an etch stop layer on the semiconductor layer at a place deviating from the first region of the semiconductor layer;

(c) modifying the first region of the semiconductor layer into a conductor; and (d) arranging a source, a drain, the data line, and a second insulation layer on the semiconductor layer, wherein, in the step (c), the first region of the semiconductor layer is modified into the conductor by being exposed to ultraviolet light;

the data line, after being broken into several segments, can be repaired through welding of the segments respectively onto the conductor beneath the data line.

2. The method according to claim 1, wherein the segments of the data line can be welded onto the conductor layer through laser.

3. The method according to claim 1, wherein the ultraviolet light used has a wavelength smaller than 400 nm.

4. The method according to claim 1, wherein the semiconductor layer is made from indium gallium zinc oxide.

5. The method according to claim 1, wherein the data line is made from copper or copper alloy.

* * * * *